(12) United States Patent
Agnaou et al.

(10) Patent No.: US 11,495,944 B2
(45) Date of Patent: Nov. 8, 2022

(54) SYSTEM FOR MANAGING TEMPERATURE IN AN ELECTRICAL ENCLOSURE

(71) Applicant: Schneider Electric Industries SAS, Rueil Malmaison (FR)

(72) Inventors: Abderrahmane Agnaou, Grenoble (FR); Josep Lopez, Barcelona (ES); Alain Perrin, Saint Nicolas de Macherin (FR)

(73) Assignee: Schneider Electric Industries SAS, Rueil-Malmaison (FR)

( * ) Notice: Subject to any disclaimer, the term of this patent is extended or adjusted under 35 U.S.C. 154(b) by 76 days.

(21) Appl. No.: 16/695,312

(22) Filed: Nov. 26, 2019

(65) Prior Publication Data
US 2020/0176958 A1 Jun. 4, 2020

(30) Foreign Application Priority Data

Dec. 4, 2018 (FR) .................................. FR1872311

(51) Int. Cl.
*H05K 7/20* (2006.01)
*H02B 1/56* (2006.01)

(52) U.S. Cl.
CPC ............ *H02B 1/565* (2013.01); *H05K 7/206* (2013.01); *H05K 7/207* (2013.01); *H05K 7/20572* (2013.01)

(58) Field of Classification Search
CPC .... H02B 1/565; H05K 7/20572; H05K 7/206; H05K 7/207
See application file for complete search history.

(56) References Cited

U.S. PATENT DOCUMENTS

| 10,111,360 B2 | 10/2018 | Perrin et al. |
| 10,524,382 B2 * | 12/2019 | Khachaturov ..... H05K 7/20909 |
| 10,892,606 B2 * | 1/2021 | Linares ............. H05K 7/20145 |

(Continued)

FOREIGN PATENT DOCUMENTS

| EP | 2789220 | 10/2014 |
| EP | 3093936 | 11/2016 |

OTHER PUBLICATIONS

English Language Machine Translation of European Patent Application Publication No. EP3093936 dated Nov. 16, 2016, 14 pages.

(Continued)

*Primary Examiner* — Mohammad Ali
*Assistant Examiner* — Vincent W Chang
(74) *Attorney, Agent, or Firm* — Locke Lord LLP

(57) ABSTRACT

A system for managing temperature, that can be adapted to an electrical enclosure, the electrical enclosure delimiting a first volume, the system comprising:
- a first chamber delimiting a closed second volume and a tank housed in the first chamber and delimiting a closed third volume inside the first chamber,
- first air transfer means arranged between a first air inlet/outlet connected to the second volume and a second air inlet/outlet intended to be connected to the first volume,
- second air transfer means arranged between a third air inlet/outlet connected to the third volume and a fourth air inlet/outlet intended to be connected to the first volume, and
- a control and processing unit intended to apply a mode of operation of the system.

20 Claims, 7 Drawing Sheets

(56) References Cited

U.S. PATENT DOCUMENTS

| | | | | |
|---|---|---|---|---|
| 2004/0007348 A1* | 1/2004 | Stoller | ................... | H05K 7/206 |
| | | | | 165/47 |
| 2006/0225449 A1* | 10/2006 | Dorrich | .............. | H05K 7/20572 |
| | | | | 62/186 |
| 2012/0100794 A1* | 4/2012 | Redshaw | ............. | H05K 7/2059 |
| | | | | 454/184 |
| 2014/0246169 A1* | 9/2014 | Perrin | ..................... | H05K 7/206 |
| | | | | 165/47 |
| 2014/0260397 A1* | 9/2014 | Agnaou | ................. | H05K 7/206 |
| | | | | 165/80.2 |
| 2016/0234974 A1* | 8/2016 | Biragoni | ............ | H05K 7/20909 |
| 2017/0219230 A1* | 8/2017 | Agnaou | .............. | F24F 11/0001 |

OTHER PUBLICATIONS

Search Report and Written Opinion for French Patent Application No. FR1872311 dated Aug. 5, 2019, 6 pages.

\* cited by examiner

SYSTEM FOR MANAGING TEMPERATURE IN AN ELECTRICAL ENCLOSURE

TECHNICAL FIELD OF THE INVENTION

The present invention relates to a system for managing temperature in an electrical enclosure.

The invention relates also to a method for managing temperature implemented using said system.

STATE OF THE ART

The management of the temperature in the chamber of an electrical enclosure, such as an electrical cabinet or a panel, is a recurrent issue. The units present in the enclosure have a tendency to heat up and it is therefore necessary to keep the temperature inside the enclosure under a certain threshold, at the risk otherwise of degrading the units. Conversely, it is also possible to have to heat up the internal space of the enclosure when the chamber undergoes temperature variations that are likely to create condensation. Such is the case in particular when the enclosure is placed outside because it can thus be very hot during the day and very cold during the night.

To address these various constraints, it is conventional practice to use a ventilation system to allow a circulation of air in the enclosure. An air-conditioning and/or heating solution can be used respectively instead or in addition in order to regulate the temperature inside the enclosure.

However, these solutions do not always prove energy-efficient.

There is still a need to propose a solution for managing temperature in an electrical enclosure, such as an electrical cabinet, which can operate to produce cold or heat, which can take account of the temperature variations, often significant, undergone by the electrical enclosure, which is reliable, efficient in terms of electrical energy and which does not require the use of specific components.

SUMMARY OF THE INVENTION

This aim is achieved by a system for managing temperature, that can be adapted to an electrical enclosure, said electrical enclosure delimiting a first volume that is closed with respect to the outside, said system comprising:

- a first chamber delimiting a closed second volume and a tank housed in said first chamber and delimiting a closed third volume inside said first chamber, distinct from the second volume,
- first air transfer means arranged between a first air inlet/outlet connected to the second volume and a second air inlet/outlet intended to be connected to the first volume,
- second air transfer means arranged between a third air inlet/outlet connected to the third volume and a fourth air inlet/outlet intended to be connected to the first volume,
- a control and processing unit comprising a first command output connected to said first air transfer means, a second command output connected to said second air transfer means and means for determining a mode of operation of said system, said mode of operation being chosen from among at least:
- a first mode of operation in which the control and processing unit controls the first air transfer means to generate a first flow of air from the second volume to said first volume and the second air transfer means to generate a second flow of air from the first volume to said third volume (V3),
- a second mode of operation in which the control and processing unit controls the first air transfer means to generate a first flow of air from the first volume to said second volume and the second air transfer means to generate a second flow of air from said third volume to said first volume.

According to a particular feature, the system comprises a third mode of operation in which the control and processing unit controls the first air transfer means and the second air transfer means to block any flow of air respectively between the first volume and the second volume and between the first volume and the third volume.

According to another particular feature, the system comprises means for determining a first period of activation of the first air transfer means and of the second air transfer means and a second period of activation of the first air transfer means and of the second air transfer means.

According to another particular feature, the first period of activation is defined by a first time interval called Dtc and defined by the following relationship:

$$Dtc = tcmax - tcmin$$

In which:
- tcmin corresponds to a first instant corresponding to the temperature (Tmax−ec),
- tcmax corresponds to a second instant corresponding to the temperature (Tmax−ec),
- Tmax corresponds to a maximum temperature value undergone by the system over a given period and ec corresponds to a first temperature difference.

According to another particular feature, the second period of activation is defined by a second time interval called Dtf and defined by the following relationship:

$$Dtf = tfmax - tfmin$$

In which:
- tfmin corresponds to a first instant corresponding to a temperature (Tmin+ef),
- tfmax corresponds to a second instant corresponding to the temperature (Tmin+ef),
- Tmin corresponds to a minimum temperature value undergone by the system over said given period and ef corresponds to a second temperature difference.

According to another particular feature, the system comprises a temperature sensor configured to supply the minimum temperature value and the maximum temperature value.

According to another particular feature, the system comprises means for connection to a meteorological data server and means for interrogating said server to obtain said minimum temperature value and said maximum temperature value and a temperature trend curve.

According to another particular feature, the system comprises a temperature sensor intended to be placed in the first volume and the control and processing unit comprises an input linked to said temperature sensor and said means for determining the mode of operation are configured to be based on temperature measurement data supplied by said sensor.

According to another particular feature, said means for determining the mode of operation comprise means for comparing each temperature datum supplied by said temperature sensor with at least one threshold value.

According to another particular feature, said means for determining the mode of operation comprise means for calculating the dew-point temperature and said system comprises means for comparing each temperature datum supplied by said temperature sensor with said dew-point temperature.

According to another particular feature, the first air transfer means comprise a first fan controlled by the control and processing unit.

According to another particular feature, the first air transfer means comprise means for blocking the first air inlet/outlet and/or the second air inlet/outlet, controlled by the control and processing unit.

According to another particular feature, the second air transfer means comprise a second fan controlled by the control and processing unit.

According to another particular feature, the second air transfer means comprise means for blocking the third air inlet/outlet and/or the fourth air inlet/outlet, controlled by the control and processing unit.

According to another particular feature, the first air transfer means and the second air transfer means comprise a plate that rotates about an axis, said plate bearing a single fan and an aperture that are diametrically opposite and being controlled by the control and processing unit to revolve about its axis between at least two positions, a first angular position in which its fan is positioned between the first air inlet/outlet and the second air inlet/outlet and its aperture is positioned between the third air inlet/outlet and the fourth air inlet/outlet and a second angular position in which its fan is positioned between the third air inlet/outlet and the fourth air inlet/outlet and its aperture is positioned between the first air inlet/outlet and the second air inlet/outlet.

According to another particular feature, the first angular position and the second angular position are obtained by a rotation of the plate of 180°.

According to another particular feature, the plate is configured to take at least one third angular position offset by 90° relative to the first angular position, said third angular position corresponding to a mode of operation in which the plate is interposed between the first air inlet/outlet and the second air inlet/outlet to block their linking and the plate is interposed between the third air inlet/outlet and the fourth air inlet/outlet to block their linking.

According to another particular feature, the tank is produced in an extendable material.

The invention relates also to an electrical installation comprising an electrical enclosure which comprises a bottom wall, a top wall and at least one side wall, so as to delimit a closed first volume, said installation comprising a system as defined above which is installed on one of its walls, the second air inlet/outlet and the fourth air inlet/outlet of the system being connected to said first volume.

The invention relates also to a method for managing temperature in an electrical installation as defined above, the method comprising the following steps:
  selection of a mode of operation of the system,
  application of said selected mode of operation by control of the first air transfer means and of the second air transfer means.

BRIEF DESCRIPTION OF THE FIGURES

Other features and advantages will emerge from the following detailed description given in light of the attached drawings in which.

DETAILED DESCRIPTION OF AT LEAST ONE EMBODIMENT

Figure 1:
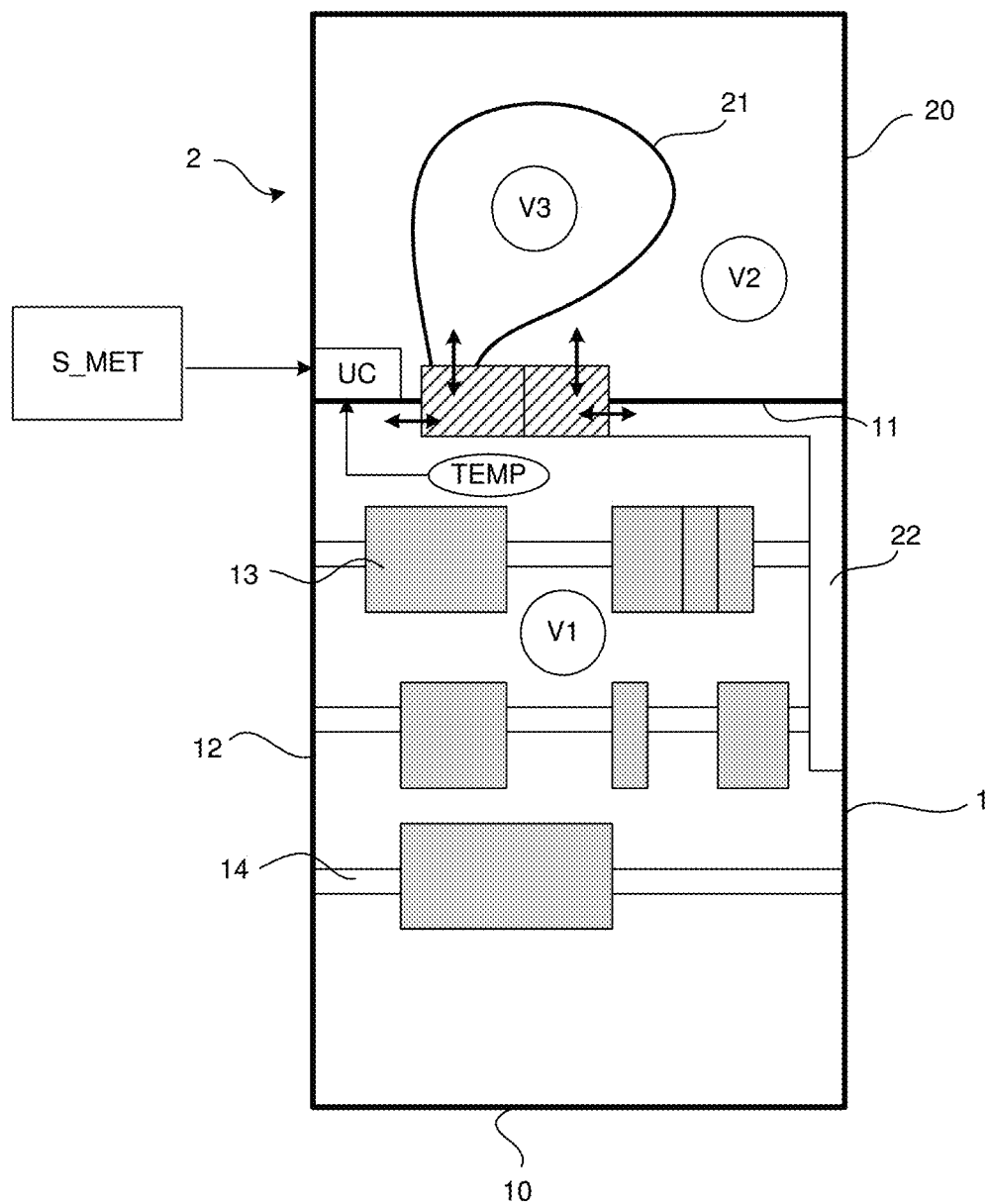
FIG. 1 represents the system for managing temperature according to the invention adapted to an electrical cabinet.
Figure 2:
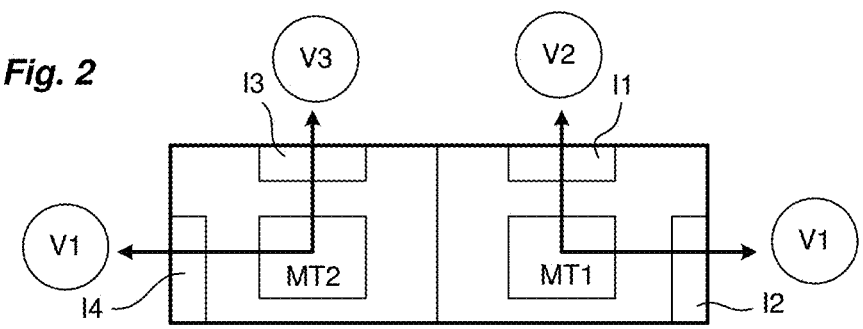
FIG. 2 represents the air transfer means employed in the system of the invention.

Referring to FIG. 1, the system for managing temperature of the invention can be adapted to an electrical enclosure. An electrical enclosure should be understood to mean an electrical cabinet, an electrical panel or equivalent. Hereinafter in the description and in the drawings, the electrical enclosure will be considered to be an electrical cabinet 1.

In a nonlimiting manner, an electrical cabinet 1 can comprise a bottom wall 10, a top wall 11 and four pairwise-opposing side walls 12. Its walls delimit a closed first internal volume V1 in which electrical units are placed. In the electrical cabinet, the electrical units 13 can be mounted on supports, such as suitable uprights and rails 14. The cabinet 1 can comprise a grating allowing its internal volume to exchange air with the outside or be completely hermetically sealed, particularly when it is intended to be employed outside. The cabinet 1 can be manufactured in a metal material.

In a nonlimiting manner, the system 2 for managing temperature according to the invention can be fixed onto the top wall 11 of the electrical cabinet.

Generally, the system 2 for managing temperature of the invention offers the particular feature of being able to store hot air during hot periods to restore it during colder periods and of being able to store cold air during cold periods to restore it during hotter periods.

For that, the system 2 according to the invention comprises a first chamber 20 delimiting a closed second volume V2, distinct from the volume V1 of the cabinet. It can be a hermetically sealed box. This chamber 20 is advantageously produced in a material that is the best heat insulator possible so as to minimize the heat exchanges between the internal space of this chamber and the outside.

The system 2 also comprises a tank 21 delimiting a closed third volume, distinct from the first volume V1 and from the second volume V2. The tank 21 is also produced in a material guaranteeing a hermetic separation of the third volume V3 with respect to the second volume V2.

The tank 21 is intended to be placed in the second volume V2 of the first chamber 20.

The tank 21 is produced in a flexible material, allowing it to vary its volume from a minimum value that can be equal to zero to a maximum value corresponding to that of the second volume V2 delimited by the chamber 20. The wall of this chamber 21 is advantageously produced in a material that is the best heat insulator possible so as to minimize the heat exchanges with the space V2.

It will be seen hereinbelow that the tank 21 can also be produced in an extendable material, of party balloon type, allowing it to be deflated and to release the air which it will previously have stored under the sole pressure of its walls.

The system 2 comprises a first air inlet/outlet I1 connected to the second volume V2 and a second air inlet/outlet I2 intended to be connected to the first volume V1 when the system 2 is adapted to the electrical cabinet 1.

The system 2 comprises a third air inlet/outlet I3 connected to the third volume V3 and a fourth air inlet/outlet I4 intended to be connected to the first volume V1 when the system 2 is adapted to the electrical cabinet 1.

All the air inlets/outlets are independent and distinct, that is to say that they do not communicate with one another.

Each air inlet/outlet can be produced in the form of a duct emerging in the closed volume considered.

The second air inlet/outlet I2 and the fourth air inlet/outlet I4 of the system are intended to be connected to corresponding openings produced on a wall of the electrical cabinet 1, for example the top wall 11 thereof.

The system 2 can comprise a chute 22 connected to the fourth air inlet/outlet I4, said chute 22 emerging inside the volume V1 of the electrical cabinet, preferentially centrally with respect to the volume V1 of the cabinet in order better to diffuse/extract the air.

The system 2 also comprises first air transfer means MT1 arranged between the first air inlet/outlet I1 and the second air inlet/outlet I2 and second air transfer means MT2 arranged between the third air inlet/outlet I3 and the fourth air inlet/outlet I4.

The first air transfer means MT1 can comprise at least one fan and be controlled to allow a transfer of air from the first air inlet/outlet I1 to the second air inlet/outlet I2, therefore from the second volume V2 to the first volume V1 when the system is adapted to the electrical cabinet 1, or from the second air inlet/outlet I2 to the first air inlet/outlet I1, therefore from the first volume V1 to the second volume V2 when the system 2 is adapted to the electrical cabinet 1.

The second air transfer means MT2 can comprise at least one fan and be controlled to allow a transfer of air from the third air inlet/outlet I3 to the fourth air inlet/outlet I4, therefore from the third volume V3 to the first volume V1 when the system 2 is adapted to the electrical cabinet 1, or from the fourth air inlet/outlet I4 to the third air inlet/outlet I3, therefore from the first volume V1 to the third volume V3 when the system 2 is adapted to the electrical cabinet 1.

The first air transfer means MT1 can comprise a first fan VENT1 arranged between the two air outlets.

The second air transfer means MT2 can comprise a second fan VENT2 arranged between the two air outlets.

It will be seen hereinbelow that, in a particular embodiment of the invention, a single fan can be employed.

According to a particular aspect of the invention, several possible modes of operation of the system 2 are distinguished:

first mode of operation MOD1: first transfer of air from the first volume V1 to the third volume V3 and simultaneous second transfer of air from the second volume V2 to the first volume V1;

second mode of operation MOD2: first transfer of air from the first volume V1 to the second volume V2 and simultaneous second transfer of air from the third volume V3 to the first volume V1.

Third mode of operation MOD3: closed system, that is to say no transfer of air from one volume to another.

Figure 3:
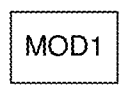
FIG. 3 schematically illustrates the air exchanges produced respectively in the first mode of operation and in the second mode of operation.
Figure 3:
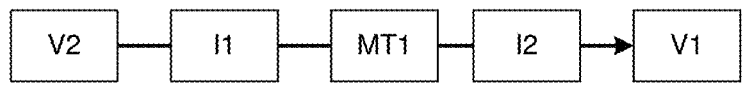
Figure 3:
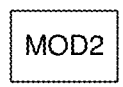
Figure 3:

FIG. 3 illustrates the air exchanges produced between the different volumes in each of the two first modes of operation.

The system 2 comprises a control and processing unit UC intended to control each mode of operation of the system.

This control and processing unit UC can in particular comprise input/output modules. The first air transfer means MT1 can be connected to a first output module of the control and processing unit UC and the second air transfer means MT2 can be connected to a second output module of the control and processing unit UC. It will be seen that the control and processing unit UC can comprise computation means allowing it to determine the mode of operation in which the system 2 must operate.

Figure 4A:
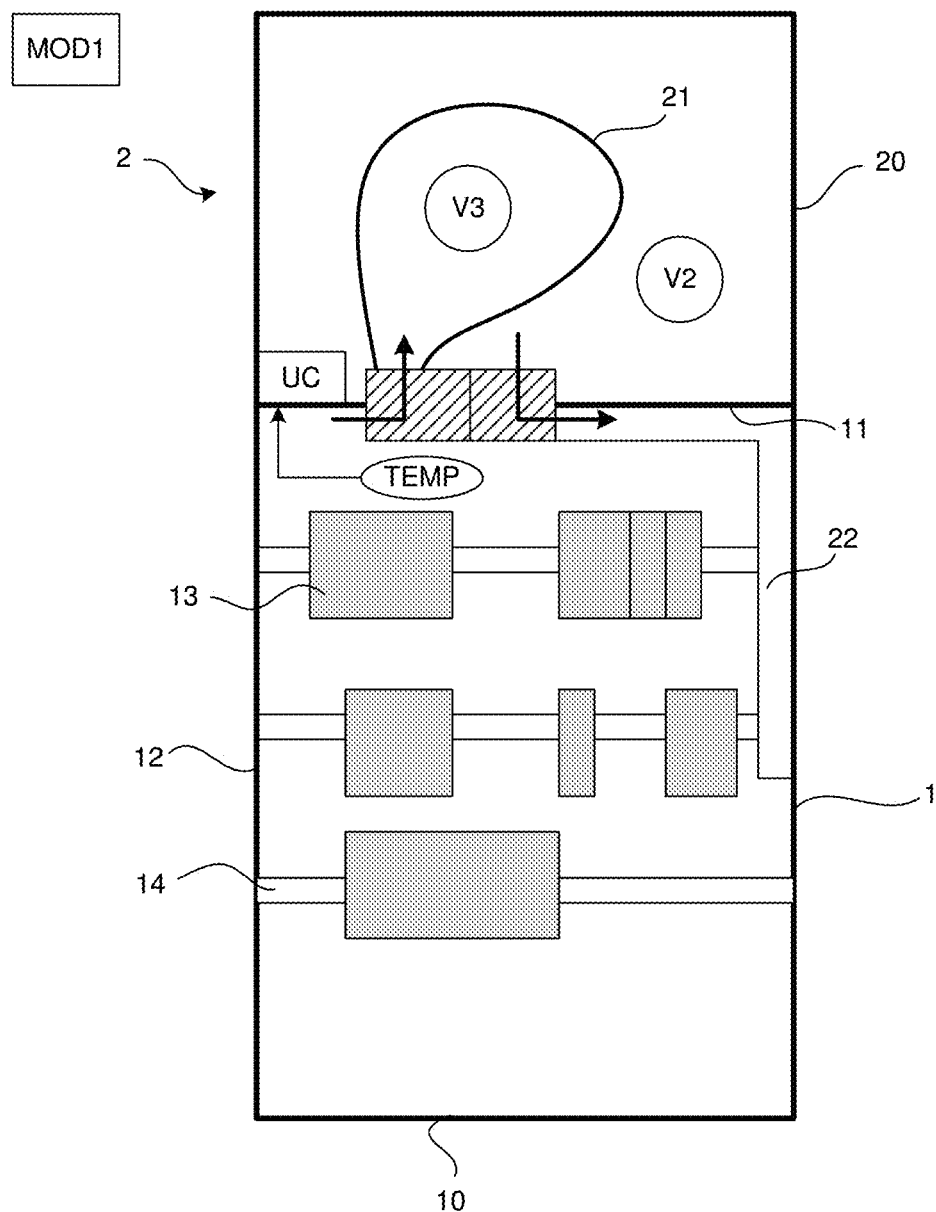
FIGS. 4A, 4B, 5A, 5B, 6A, 6B illustrate the different operating states of the system of the invention.
Figure 4B:
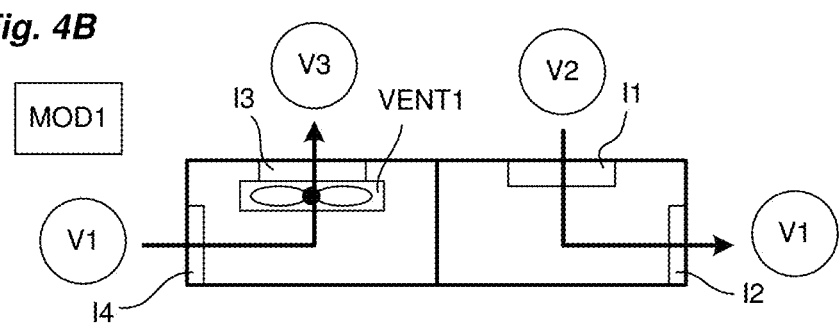

Referring to FIGS. 4A and 4B, in the first mode of operation MOD1, the second air transfer means MT2, that is to say the second fan VENT2, are controlled by the control and processing unit UC to suck the air present in the first volume V1 and transfer it to the third volume V3. At the same time, the expansion of the tank 21 inside the chamber 20 pushes the air present in the volume V2 to the volume V1, through the first air inlet/outlet I1 and the second air inlet/outlet I2. If there is a fan present between the latter two inlets/outlets, said fan can assist in the transfer of air from the volume V2 to the volume V1 but this fan remains optional. The air can be injected from the volume V2 to the volume V1 via said chute 22.

Figure 5A:
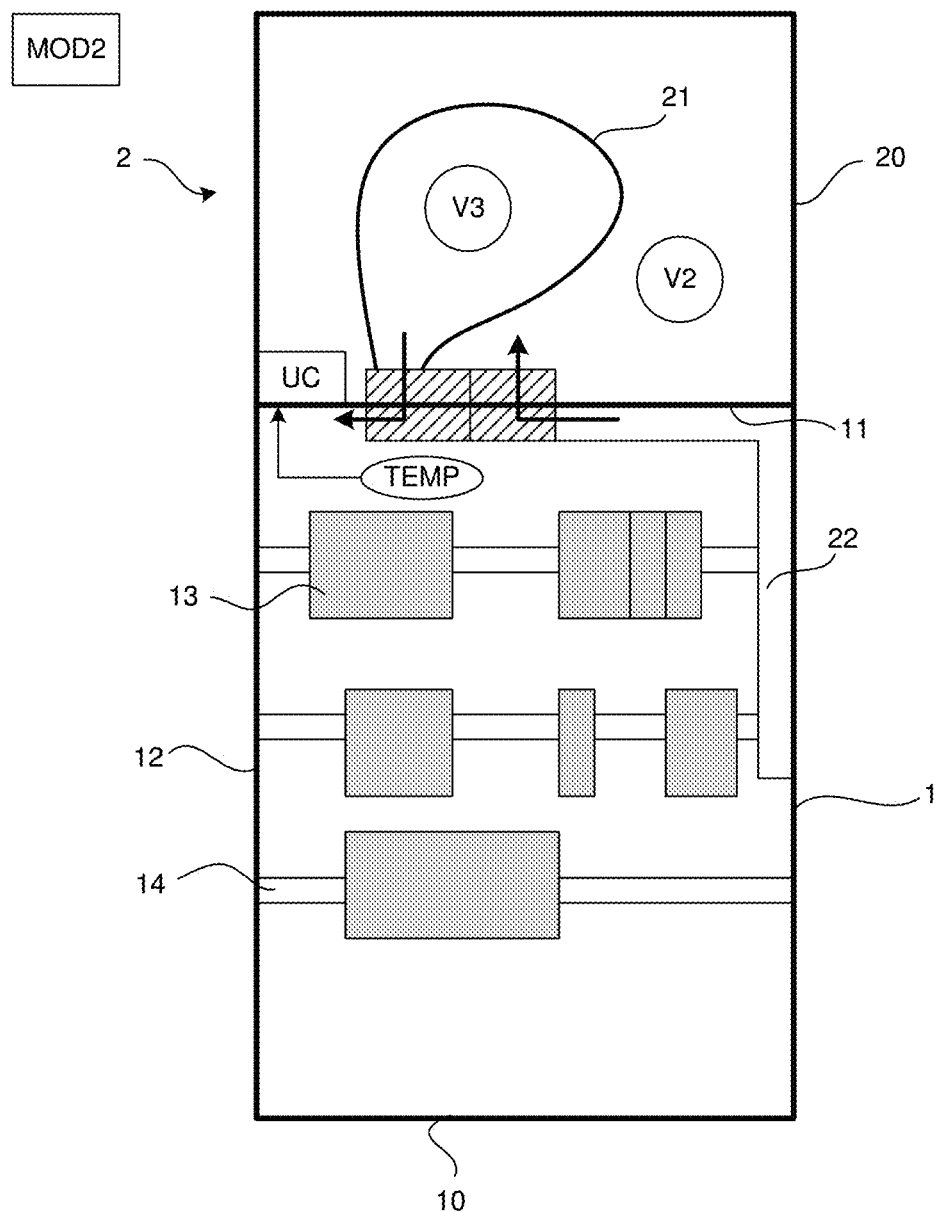
Figure 5B:
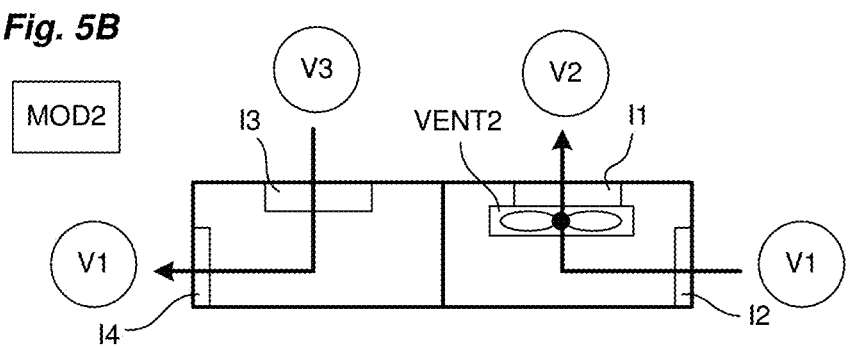

Referring to FIGS. 5A and 5B, in the second mode of operation MOD2, the first air transfer means MT1, that is to say the first fan VENT1, are controlled by the control and processing unit UC to suck the air present in the first volume V1 and transfer it into the second volume V2. At the same time, the air injected into the second volume V2 compresses the tank, forcing the air present in the third volume V3 to be expelled to the first volume V1, through the third air inlet/outlet I3 and the fourth air inlet/outlet I4. If there is a fan present between the latter two inputs/outputs, said fan can assist in the transfer of air from the volume V3 to the volume V1 but this fan remains optional.

Figure 6A:
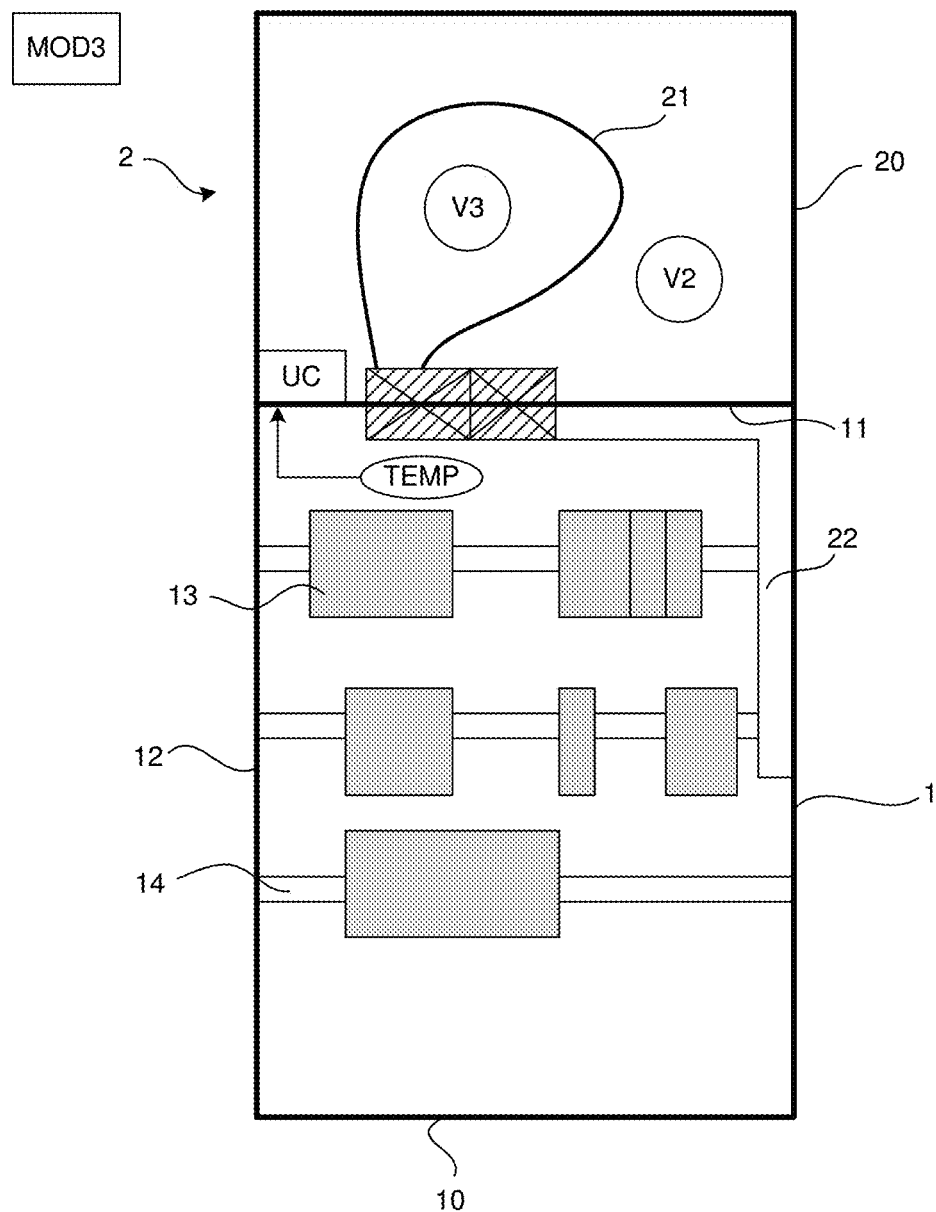
Figure 6B:
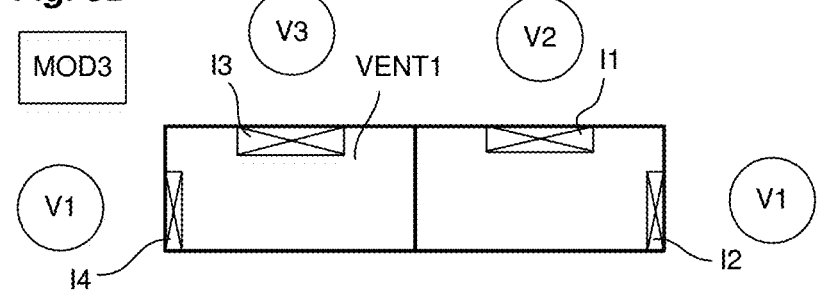

In FIGS. 6A and 6B, the transfers of air from one volume to another are interrupted. This is therefore the third mode of operation MOD3, in which the air inlets/outlets of the system are blocked.

In a nonlimiting but particularly advantageous manner, the system 2 can operate with only a single fan for the two modes of operation MOD1, MOD2 described above. This one and the same fan VENT is in fact employed alternately as first air transfer means MT1 or as second air transfer means MT2, depending on the mode of operation of the system. Thus, this single fan VENT is employed in the first mode of operation MOD1 for the first transfer of air from the volume V1 to the volume V3 and a single and unique opening O is then employed to produce the second transfer of air from the volume V2 to the volume V1. And, in the second mode of operation, this single fan VENT is employed for the first transfer of air from the volume V1 to the volume V2 whereas said opening O is employed for the second transfer of air from the volume V3 to the volume V1.

In this embodiment with a single fan VENT, referring to FIGS. 7A to 7E, the system 2 can comprise a plate 23 mounted to rotate on itself about an axis. The plate 23 comprises the opening O and bears the fan VENT which is fixed onto the plate 23 in a diametrically opposite position with respect to that of said opening O. By making the plate 23 revolve about its axis between several distinct fixed angular positions, it is thus possible to position the fan VENT and the opening O in the position necessary to the mode of operation to be applied.

Figure 7A:
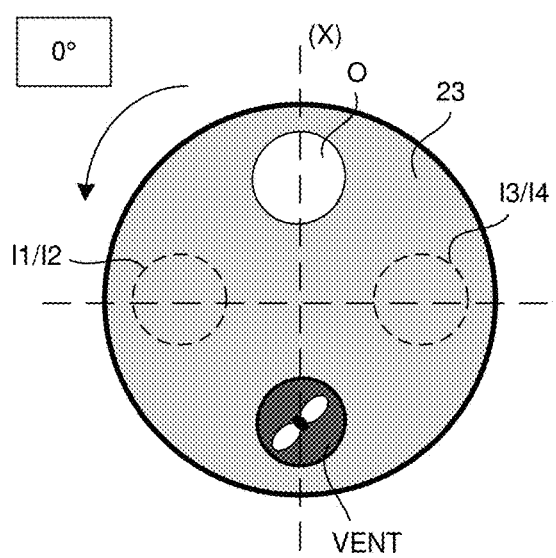
FIGS. 7A to 7E represent an example embodiment of a part of the system of the invention and illustrate its principle of operation.

In FIG. 7A, the plate 23 is in a first angular position, said to be at 0° with respect to a vertical axis (X) at right angles to its axis of rotation and situated in the plane of the plate 23, this position being the reference position of the plate 23. In this first position, the plate 23 is interposed between the first air inlet/outlet I1 and the second air inlet/outlet I2 and between the third air inlet/outlet I3 and the fourth air inlet/outlet I4, preventing any flow of air from passing from one volume to the other. The system is therefore in the third mode of operation MOD3, that is to say in closed mode.

Figure 7B:
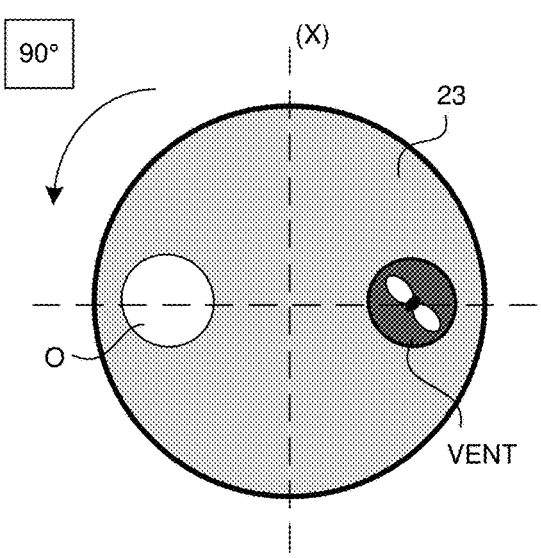

In FIG. 7B, the plate 23 is in a second angular position, said to be at 90° (rotation in the counterclockwise direction) with respect to said vertical axis (X). In this second position, the fan VENT is placed between the third air inlet/outlet I3 and the fourth air inlet/outlet I4 and the opening O which is diametrically opposite is therefore placed between the first air inlet/outlet I1 and the second air inlet/outlet I2. The system 2 is therefore ready to operate according to the first mode of operation MOD1.

Figure 7C:
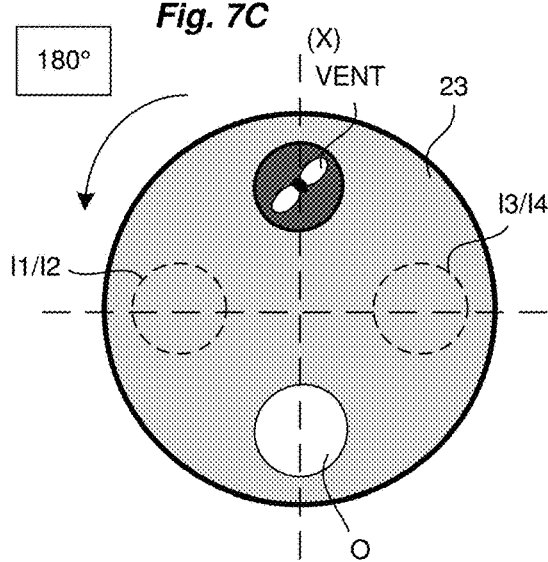

In FIG. 7C, the plate 23 is in a third angular position, said to be at 180° with respect to said vertical axis (X). In this third position, the plate 23 is interposed between the first air inlet/outlet I1 and the second air inlet/outlet I2 and between the third air inlet/outlet I3 and the fourth air inlet/outlet I4, preventing any flow of air from passing from one volume to the other. The system is therefore in the third mode of operation MOD3, that is to say in closed mode.

Figure 7D:
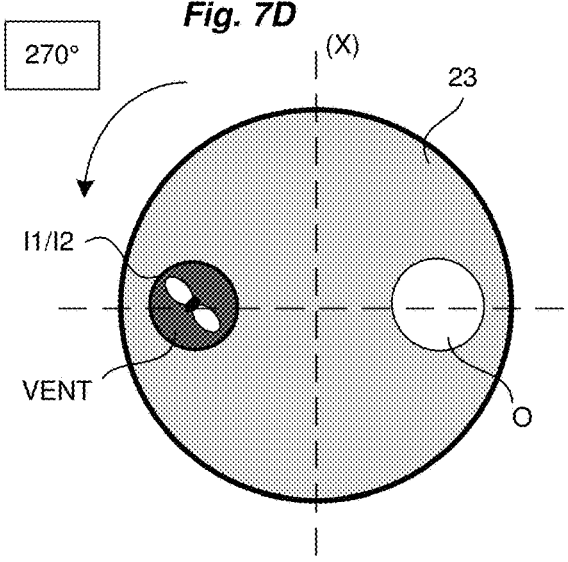

In FIG. 7D, the plate 23 is in a third angular position, said to be at 270° with respect to said vertical axis (X). In this third position, the fan VENT is located facing the first air inlet/outlet I1 and the second air inlet/outlet I2 and the opening O is located facing the third air inlet/outlet I3 and the fourth air inlet/outlet I4. The system is therefore ready to operate according to the second mode of operation MOD2.

The plate 23 can be fixed onto the axis of an electric motor connected to an output module of the control and processing unit UC. Depending on the mode of operation to be applied, the control and processing unit UC controls the electric motor to make the plate revolve and make it take the desired angular position.

Figure 7E:
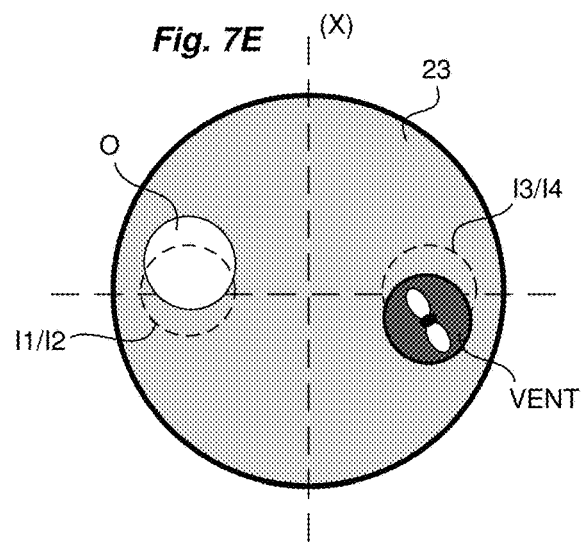

According to a particular aspect of the invention, to regulate the flow of air to each volume, it is possible to control the position of the opening O produced on the plate. By making the angular position of the plate 23 vary by motor control, the control and processing unit UC can control the position of the opening with respect to the two air inlets/outlets and thus increase or reduce the flow of air in a simple manner. The control of the flow of air can be performed by the control and processing unit by taking into account different parameters (mode of operation applied, temperature(s), operating fault, etc.). FIG. 7E thus shows an intermediate position of the plate in which the opening O is partially facing two air inlets/outlets.

According to a particular aspect of the invention, in the first mode of operation the first transfer of air from the volume V1 to the volume V3 is a so-called hot transfer of air, whereas the second transfer of air from the volume V2 to the volume V1 is a so-called cold transfer of air.

In the second mode of operation, the first transfer of air from the volume V1 to the volume V2 is a so-called cold transfer of air, whereas the second transfer of air from the volume V3 to the volume V1 is a so-called hot transfer of air.

Each mode of operation can be controlled according to different variant embodiments explained hereinbelow.

In a first variant embodiment, the aim is to define several periods of time of operation of the system. At least one first period corresponds to a so-called hot time interval while at least one second period corresponds to a so-called cold time interval.

To define each of the two periods, the computation means of the control and processing unit consider a period T (for example equal to a day) and determines, over this period T, the variation of the temperature to which the electrical cabinet is exposed. The temperature variation curve can be generated by taking account of the weather forecast data for the place where the electrical cabinet is located or on the basis of weather data obtained for the same period, a preceding year, or after a learning period, or by any other means. The control and processing unit can in particular have access to a weather data server (S_MET—FIG. 1) allowing it to have data necessary to the creation of the curve.

Figure 8:
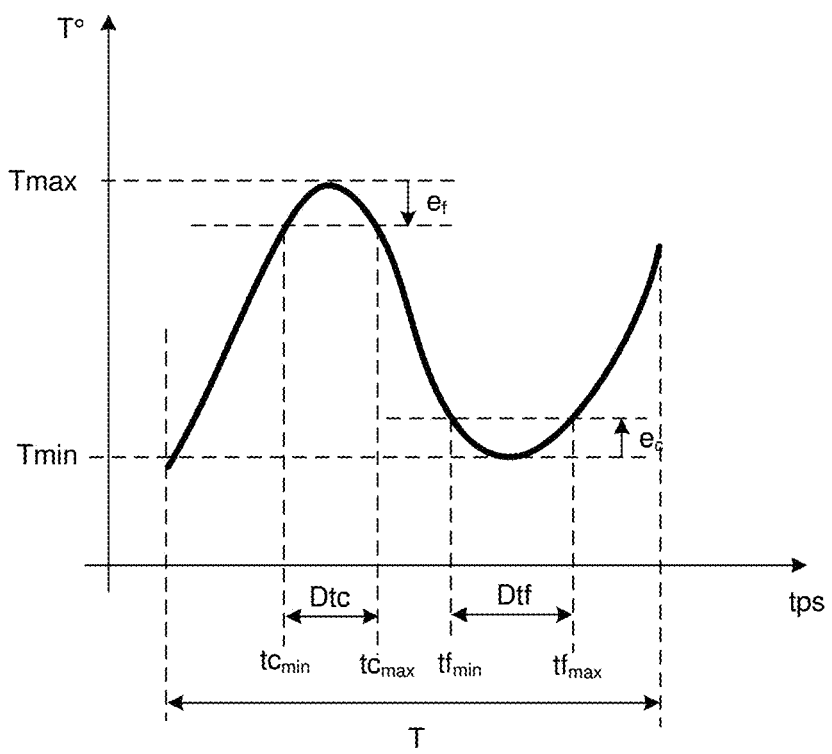
FIG. 8 represents, by a curve, a principle of control of the temperature by the system of the invention.

An example temperature variation curve over this period T is represented in FIG. 8.

Over the period T and from the curve, it can be seen that the temperature increases until it reaches a maximum value Tmax to then decrease to reach a minimum value Tmin. The temperature amplitude over this period is therefore Tmax−Tmin.

To define the cold and hot time intervals, the computation means proceed as set out below.

There are defined:
Dtf: cold time interval=$tf_{max}-tf_{min}$
Dtc: hot time interval=$tc_{max}-tc_{min}$
with:
$tc_{min}$: first instant corresponding to a temperature $(T_{max}-e_c)$
$tc_{max}$: second instant corresponding to a temperature $(T_{max}-e_c)$
$tf_{min}$: first instant corresponding to a temperature $(T_{min}+e_c)$
$tf_{max}$: second instant corresponding to a temperature $(T_{min}+e_c)$
and:
$e_c$, $e_f$: adjustable parameters corresponding to temperature differences that make it possible to contain the maximum value and the minimum value in a given time interval.

In a nonlimiting manner, it will be possible to define that (Tmax−$e_c$) corresponds to a maximum operating temperature of the units and that (Tmin+$e_f$) corresponds to a minimum operating temperature of the units.

During the computed hot time interval, the control and processing unit UC is required to apply the first mode of operation MOD1.

During the cold time interval, the control and processing unit UC is required to apply the second mode of operation MOD2.

In any other situation, the control and processing unit UC can be required to apply the third mode of operation.

In a second variant embodiment, the control and processing unit UC applies the suitable mode of operation by taking account of the temperature measured inside the electrical cabinet 1, therefore inside the volume V1. In this case, it is a temperature regulation principle which is applied. Thus, the control and processing unit UC can operate as follows:

If the measured temperature is above a predefined threshold value, the control and processing unit triggers the first mode of operation in order to transfer cold air into the volume V1 of the cabinet and therefore cool the electrical units.

If the measured temperature is below a predefined threshold value, the control and processing unit triggers the second mode of operation in order to transfer hot air into the volume V1 of the cabinet and therefore heat up the interior of the electrical cabinet.

In this latter embodiment, the system can comprise a temperature sensor TEMP (represented in FIG. 1) connected to an input module of the control and processing unit UC and placed inside the electrical cabinet 1 in order to collect temperature measurement data.

In a particular embodiment, during a cold interval, the control and processing unit UC can implement a regulation by comparing the temperature present in the volume V1 of the electrical cabinet with the dew-point temperature.

As a reminder, the dew-point temperature is calculated from the following relationship:

$$T° \text{ dew point} = \frac{237.3}{\left[\text{Log}_{10}(RH) + \left(\frac{7.5 \times T_{int}}{237.3 + T_{int}}\right) - 2\right]^{-1}} \quad [\text{Math. 1}]$$

With RH which corresponds to the relative humidity in the volume V1 of the electrical cabinet and Tint which corresponds to the temperature inside the volume V1 of the electrical cabinet.

During the cold interval, the computation means of the control and processing unit compare the temperature, determine the dew-point temperature for each measured temperature value in the volume V1 of the electrical cabinet, then compare each measured value with the corresponding dew-point temperature:

If the measured temperature value is lower than the calculated dew-point temperature, the control and processing unit UC applies the second mode of operation MOD2 until the measured temperature becomes greater than the corresponding dew-point temperature, and does this in order to eliminate possible condensation.

If the measured temperature value is above the calculated dew-point temperature, there is no risk of formation of condensation and therefore the control and processing unit UC does not force any mode of operation, that is to say that no transfer of air is ordered between the volumes.

In this embodiment, the system can also incorporate the temperature sensor TEMP connected to an input module of the control and processing unit UC and placed inside the electrical cabinet 1 in order to collect temperature measurement data. To determine the dew-point temperature, the system can comprise a moisture sensor connected to another input module of the control and processing unit UC in order to collect the moisture measurement data inside the electrical cabinet.

According to different particular aspects, as already stated above, the tank 21 can be produced in a non-elastic (or non-extendable) material or in an extendable material. In the latter case, the pressure exerted by the walls of the tank 21 makes it possible to naturally release the air present in the tank in the second mode of operation. In this mode of operation, the single fan VENT employed between the volume V1 and the volume V2 can even be stopped.

The solution of the invention thus offers many advantages, including the facts that:
- it is simple to implement and can be easily adapted to an existing electrical cabinet;
- it uses only conventional ventilation solutions to operate;
- it makes it possible to adapt easily to the external temperature conditions.

The invention claimed is:

1. System for managing temperature of an electrical enclosure, said electrical enclosure delimiting a first volume that is closed with respect to an outside, said system comprising:
   - a first chamber delimiting a closed second volume and a tank housed in said first chamber and delimiting a closed third volume inside said first chamber, distinct from the second volume,
   - first air transfer means arranged between a first air inlet/outlet connected to the second volume and a second air inlet/outlet connected to the first volume, and
   - second air transfer means arranged between a third air inlet/outlet connected to the third volume and a fourth air inlet/outlet connected to the first volume,
   - wherein said system is configured to operate according to a mode of operation being chosen from among at least:
     - a first mode of operation in which the first air transfer means is operated to generate a first flow of air from the second volume to said first volume and the second air transfer means is operated to generate a second flow of air from the first volume to said third volume, and
     - a second mode of operation in which the first air transfer means is operated to generate a first flow of air from the first volume to said second volume and the second air transfer means is operated to generate a second flow of air from said third volume to said first volume.

2. System according to claim 1, further comprising a third mode of operation in which the first air transfer means and the second air transfer means are operated to block any flow of air respectively between the first volume and the second volume and between the first volume and the third volume.

3. System according to claim 1, wherein a first period of activation of the first air transfer means and of the second air transfer means is determined and a second period of activation of the first air transfer means and of the second air transfer means is determined.

4. System according to claim 3, wherein the first period of activation is defined by a first time interval Dtc defined by the following relationship:

$$Dtc = tc_{max} - tc_{min}$$

in which:
- $tc_{min}$ corresponds to a first instant corresponding to the temperature $(T_{max} - e_c)$,
- $tc_{max}$ corresponds to a second instant corresponding to the temperature $(T_{max} - e_c)$,
- Tmax corresponds to a maximum temperature value undergone by the system over a given period and $e_c$ corresponds to a first temperature difference.

5. System according to claim 3, wherein the second period of activation is defined by a second time interval Dtf defined by the following relationship:

$$Dtf = tf_{max} - tf_{min}$$

in which:
- $tf_{min}$ corresponds to a first instant corresponding to a temperature $(T_{min} + e_f)$,
- $tf_{max}$ corresponds to a second instant corresponding to the temperature $(T_{min} + e_f)$,
- Tmin corresponds to a minimum temperature value undergone by the system over said given period and $e_f$ corresponds to a second temperature difference.

6. System according to claim 4, further comprising a temperature sensor configured to supply the minimum temperature value and the maximum temperature value.

7. System according to claim 4, wherein a meteorological data server is interrogated to obtain said minimum temperature value and said maximum temperature value and a temperature trend curve.

8. System according to claim 1, further comprising a temperature sensor placed in the first volume and wherein said means for determining the mode of operation are configured to be based on temperature measurement data supplied by said sensor.

9. System according to claim 8, wherein the mode of operation is determined by comparing each temperature datum supplied by said temperature sensor with at least one threshold value.

10. System according to claim 8, wherein the mode of operation is determined by calculating the dew-point temperature and comparing each temperature datum supplied by said temperature sensor with said dew-point temperature.

11. System according to claim 1, wherein the first air transfer means comprise a first fan.

12. System according to claim 1, wherein the first air transfer means comprise means for blocking the first air inlet/outlet and/or the second air inlet/outlet.

13. System according to claim 1, wherein the second air transfer means comprise a second fan.

14. System according to claim 1, wherein the second air transfer means comprise means for blocking the third air inlet/outlet and/or the fourth air inlet/outlet.

15. System according to claim 1, wherein the first air transfer means and the second air transfer means comprise a plate configured to rotate about an axis, said plate bearing a single fan and an aperture that are diametrically opposite and being configured to revolve about its axis between at least two positions, a first angular position in which its fan is positioned between the first air inlet/outlet and the second air inlet/outlet and its aperture is positioned between the third inlet/outlet and the fourth air inlet/outlet and a second angular position in which its fan is positioned between the third air inlet/outlet and the fourth air inlet/outlet and its aperture is positioned between the first air inlet/outlet and the second air inlet/outlet.

16. System according to claim 15, wherein the first angular position and the second angular position are obtained by a rotation of the plate of 180°.

17. System according to claim 15, wherein the plate is configured to take at least one third angular position offset by 90° relative to the first angular position, said third angular position corresponding to a mode of operation in which the plate is interposed between the first air inlet/outlet and the second air inlet/outlet to block their linking and the plate is interposed between the third air inlet/outlet and the fourth air inlet/outlet to block their linking.

18. System according to claim 1, wherein the tank is produced in an extendable material.

19. System according to claim 1, wherein the electrical enclosure comprises a bottom wall, a top wall and at least one side wall, so as to delimit the closed first volume, wherein the system as defined in claim 1 is installed on one of the walls, the second air inlet/outlet and the fourth air inlet/outlet of the system being connected to said first volume.

20. Method for managing temperature of an electrical enclosure, said electrical enclosure delimiting a first volume that is closed with respect to an outside, the method comprising:

selecting a mode of operation of a system comprising:
  a first chamber delimiting a closed second volume and a tank housed in said first chamber and delimiting a closed third volume inside said first chamber, distinct from the second volume,
  first air transfer means arranged between a first air inlet/outlet connected to the second volume and a second air inlet/outlet connected to the first volume, and
  second air transfer means arranged between a third air inlet/outlet connected to the third volume and a fourth air inlet/outlet connected to the first volume,
  wherein said mode of operation being chosen from among at least:
    (1) a first mode of operation in which the first air transfer means is operated to generate a first flow of air from the second volume to the first volume and the second air transfer means is operated to generate a second flow of air from the first volume to the third volume, and
    (2) a second mode of operation in which the first air transfer means is operated to generate a first flow of air from the first volume to the second volume and the second air transfer means is operated to generate a second flow of air from the third volume to the first volume; and
applying said selected mode of operation by control of the first air transfer means and of the second air transfer means.

* * * * *